United States Patent
Erington et al.

(10) Patent No.: US 10,352,995 B1
(45) Date of Patent: Jul. 16, 2019

(54) SYSTEM AND METHOD OF MULTIPLEXING LASER TRIGGERS AND OPTICALLY SELECTING MULTIPLEXED LASER PULSES FOR LASER ASSISTED DEVICE ALTERATION TESTING OF SEMICONDUCTOR DEVICE

(71) Applicant: NXP USA, Inc., Austin, TX (US)

(72) Inventors: Kent B. Erington, Austin, TX (US); Daniel J. Bodoh, Austin, TX (US); Kristofor J. Dickson, Austin, TX (US)

(73) Assignee: NXP USA, INC., Austin, TX (US)

( * ) Notice: Subject to any disclaimer, the term of this patent is extended or adjusted under 35 U.S.C. 154(b) by 4 days.

(21) Appl. No.: 15/908,374

(22) Filed: Feb. 28, 2018

(51) Int. Cl.
- G01R 31/311 (2006.01)
- G01B 11/27 (2006.01)
- G01R 31/30 (2006.01)
- G01R 31/319 (2006.01)

(52) U.S. Cl.
CPC .......... G01R 31/311 (2013.01); G01B 11/272 (2013.01); G01R 31/30 (2013.01); G01R 31/31917 (2013.01)

(58) Field of Classification Search
CPC ............. G01R 31/311; G01R 31/31917; G01R 31/30; G01B 11/272
USPC ............... 324/762.09, 762.01, 537
See application file for complete search history.

(56) References Cited

U.S. PATENT DOCUMENTS

| | | |
|---|---|---|
| 5,140,989 A | 8/1992 | Lewis et al. |
| 5,982,789 A | 11/1999 | Marshall et al. |
| 6,712,480 B1 | 3/2004 | Leung et al. |
| 6,767,751 B2 | 7/2004 | Hunter |
| 6,782,205 B2 | 8/2004 | Trisnadi et al. |
| 6,785,001 B2 | 8/2004 | Almarzouk et al. |
| 6,800,238 B1 | 10/2004 | Miller |
| 6,801,354 B1 | 10/2004 | Payne et al. |

(Continued)

FOREIGN PATENT DOCUMENTS

| | | |
|---|---|---|
| CA | 2463502 | 4/2003 |
| CA | 2676737 | 12/2010 |

(Continued)

OTHER PUBLICATIONS

Bodoh, D., "Improving the DLS Workfow", ISTFA 2012.

(Continued)

*Primary Examiner* — Giovanni Astacio-Oquendo

(57) ABSTRACT

A pulse laser test system including a conditioning pulse circuit, a probe pulse circuit, a pulse laser, a trigger mode controller, and a laser pulse modulator. The conditioning pulse circuit provides asynchronous conditioning trigger pulses at a selected rate. The probe pulse circuit provides a synchronized probe trigger pulse. The trigger mode controller selects the probe pulse circuit while the synchronized probe trigger pulse is provided causing the pulse laser to provide a synchronized probe laser pulse, and otherwise selects the output of the conditioning pulse circuit causing the pulse laser to provide asynchronous conditioning laser pulses. The laser pulse modulator has an optical input coupled to the laser output of the pulse laser, has a gating input receiving a gate signal from the trigger mode controller, and has an optical output that provides laser pulses passed from the pulse laser while the gate signal is asserted.

20 Claims, 4 Drawing Sheets

(56) References Cited

U.S. PATENT DOCUMENTS

| | | | |
|---|---|---|---|
| 6,813,059 B2 | 11/2004 | Hunter et al. | |
| 6,829,077 B1 | 12/2004 | Maheshwari | |
| 6,839,479 B2 | 1/2005 | Berger et al. | |
| 6,872,984 B1 | 3/2005 | Leung | |
| 6,908,201 B2 | 6/2005 | Gudeman et al. | |
| 6,922,272 B1 | 7/2005 | de Groot et al. | |
| 6,922,273 B1 | 7/2005 | Maheshwari et al. | |
| 6,927,891 B1 | 8/2005 | Maheshwari | |
| 6,928,207 B1 | 8/2005 | Trisnadi et al. | |
| 6,934,070 B1 | 8/2005 | Maheshwari et al. | |
| 6,947,613 B1 | 9/2005 | Roxlo | |
| 6,956,995 B1 | 10/2005 | Shafaat et al. | |
| 6,967,491 B2 | 11/2005 | Perdu et al. | |
| 6,987,600 B1 | 1/2006 | Maheshwari | |
| 7,027,202 B1 | 4/2006 | Hunter et al. | |
| 7,042,611 B1 | 5/2006 | Gudeman et al. | |
| 7,046,420 B1 | 5/2006 | Hunter et al. | |
| 7,049,164 B2 | 5/2006 | Bruner | |
| 7,054,515 B1 | 5/2006 | Trisnadi et al. | |
| 7,057,795 B2 | 6/2006 | Hunter et al. | |
| 7,057,819 B1 | 6/2006 | Maheshwari | |
| 7,068,372 B1 | 6/2006 | Trisnadi et al. | |
| 7,167,620 B2 | 1/2007 | Handelman | |
| 7,177,081 B2 | 2/2007 | Tomita et al. | |
| 7,286,764 B1 | 10/2007 | Trisnadi et al. | |
| 7,391,973 B1 | 6/2008 | Corrigan et al. | |
| 7,394,476 B2 | 7/2008 | Cordingley et al. | |
| 7,474,827 B2 | 1/2009 | Handelman | |
| 7,805,049 B2 | 9/2010 | Handelman | |
| 7,838,794 B2 | 11/2010 | Gu et al. | |
| 7,872,489 B2 | 1/2011 | Dickson et al. | |
| 7,884,633 B2 | 2/2011 | Potok et al. | |
| 7,973,545 B2 | 7/2011 | Erington et al. | |
| 8,019,585 B2 | 9/2011 | Rahman et al. | |
| 8,582,614 B2 | 11/2013 | Meier et al. | |
| 8,860,447 B2 | 10/2014 | Vedagarbha et al. | |
| 9,148,710 B2 | 9/2015 | Archambault et al. | |
| 9,201,096 B2 | 12/2015 | Vedagarbha et al. | |
| 9,570,880 B2 | 2/2017 | Fermann et al. | |
| 9,595,802 B2 | 3/2017 | Fermann et al. | |
| 9,667,317 B2 | 5/2017 | Gross et al. | |
| 9,671,456 B2 | 6/2017 | Weizman et al. | |
| 9,674,560 B1 | 6/2017 | Harvey et al. | |
| 9,674,711 B2 | 6/2017 | Bennett et al. | |
| 9,685,992 B2 | 6/2017 | Bennett et al. | |
| 9,705,561 B2 | 7/2017 | Henry et al. | |
| 9,705,610 B2 | 7/2017 | Barzegar et al. | |
| 9,722,318 B2 | 8/2017 | Adriazola et al. | |
| 9,729,197 B2 | 8/2017 | Gross et al. | |
| 9,735,833 B2 | 8/2017 | Gross et al. | |
| 9,739,831 B2 | 8/2017 | Goh et al. | |
| 9,742,462 B2 | 8/2017 | Bennett et al. | |
| 9,742,521 B2 | 8/2017 | Henry et al. | |
| 9,748,626 B2 | 8/2017 | Henry et al. | |
| 9,749,053 B2 | 8/2017 | Henry et al. | |
| 9,749,083 B2 | 8/2017 | Henry et al. | |
| 9,768,833 B2 | 9/2017 | Fuchs et al. | |
| 9,769,020 B2 | 9/2017 | Henry et al. | |
| 9,769,128 B2 | 9/2017 | Gross et al. | |
| 9,780,834 B2 | 10/2017 | Henry et al. | |
| 9,787,412 B2 | 10/2017 | Henry et al. | |
| 9,793,951 B2 | 10/2017 | Henry et al. | |
| 9,793,954 B2 | 10/2017 | Bennett et al. | |
| 9,793,955 B2 | 10/2017 | Henry et al. | |
| 9,800,327 B2 | 10/2017 | Gerszberg et al. | |
| 9,806,818 B2 | 10/2017 | Henry et al. | |
| 9,855,099 B2 * | 1/2018 | Wu | A61B 18/22 |
| 2003/0099018 A1 | 5/2003 | Singh et al. | |
| 2004/0134894 A1 | 7/2004 | Gu et al. | |
| 2004/0134896 A1 | 7/2004 | Gu et al. | |
| 2006/0192845 A1 | 8/2006 | Cordingley et al. | |
| 2007/0002328 A1 | 1/2007 | Woods et al. | |
| 2007/0199927 A1 | 8/2007 | Gu et al. | |
| 2009/0083600 A1 | 3/2009 | Rahman et al. | |
| 2012/0056626 A1 | 3/2012 | Vedagarbha et al. | |
| 2012/0320450 A1 | 12/2012 | Starodoumov et al. | |
| 2013/0314116 A1 | 11/2013 | Vedagarbha et al. | |
| 2014/0077971 A1 | 3/2014 | Archambault et al. | |
| 2014/0285227 A1 | 9/2014 | Serrels et al. | |
| 2016/0202313 A1 | 7/2016 | Vedagarbha et al. | |
| 2016/0276184 A1 * | 9/2016 | Wang | H01L 21/324 |
| 2016/0278196 A1 * | 9/2016 | Beijsens | H05G 2/005 |

FOREIGN PATENT DOCUMENTS

| | | |
|---|---|---|
| CN | 10557071 | 5/2009 |
| CN | 102401632 | 4/2012 |
| CN | 203504761 | 3/2014 |
| DE | 19622184 | 12/1997 |
| DE | 19919584 | 11/2000 |
| DE | 19925960 | 1/2001 |
| EP | 1436931 | 7/2004 |
| EP | 1689554 | 8/2006 |
| EP | 2428807 | 3/2012 |
| IN | 202924 | 9/2005 |
| IN | 2007DN06079 | 8/2007 |
| JP | 5873669 | 3/2012 |
| JP | 2012058247 | 3/2012 |
| JP | 2015006650 | 1/2015 |
| JP | 2015517667 | 6/2015 |
| JP | 2016521352 | 7/2016 |
| JP | 6200947 | 9/2017 |
| SG | 179362 | 4/2012 |
| SG | 11201407582 S | 12/2014 |
| SG | 10201507213 U | 10/2015 |
| SG | 10201607265 W | 10/2016 |
| SG | 10201609595 U | 1/2017 |
| TW | 201211561 | 3/2012 |
| TW | 201411157 | 3/2014 |
| TW | I479167 | 3/2014 |
| TW | I440869 | 6/2014 |
| TW | 201447335 | 12/2014 |
| WO | WO2003032549 | 4/2003 |
| WO | WO2005038994 | 4/2005 |
| WO | WO2005038995 | 4/2005 |
| WO | WO2006114557 | 11/2006 |
| WO | WO2007092803 | 8/2007 |
| WO | WO2008074941 | 6/2008 |
| WO | WO2011163353 | 12/2011 |
| WO | WO2012173939 | 12/2012 |
| WO | WO2013188046 | 12/2013 |
| WO | WO2014160618 | 10/2014 |
| WO | WO2015061411 | 4/2015 |

OTHER PUBLICATIONS

Bodoh, D., "Root Cause Analysis Techniques Using Picosecond Time Resolved LADA", ISTFA 2014.

Buchner, S., "Pulsed-Laser Testing Methodology for Single Event Transients in Linear Devices", IEEE Transactions on Nuclear Science, vol. 51, No. 6, Dec. 2004.

Douin, A., "infuence of Laser Pulse Duration in Single Event Upset Testing", IEEE Transactions on Nuclear Science, vol. 53, No. 4, Aug. 2006.

Erington, K., "Measuring Propagation Delays of Critical Paths Using Time-Resolved LADA", IEEE 2014.

Goh, S.H., "Fault isolation using Electricaily-enhanced LADA (EeLADA)", IEEE 2015.

Kasapi, S., "Advanced Scan Chain Failure Analysis Using Laser Modulation Mapping and Continuous Wave Probing", ISTFA Exchange Paper 2011.

Kiyan, T., "Timing Sensitivity Analysis of Logical Nodes in Scan Design Integrated Circuits by Pulsed Diode Laser Stimulation", Proceedings from the 34th International Symposium for Testing and Failure Analysis, Nov. 2-6, 2008.

Liao, J., "Scan chain failure analysis using laser voltage imaging"; Microelectronics Reliability, vol. 50, issues 9-11, pp. 1422-1426, 2010.

Melinger, J.S., "Critical Evaluation of the Pulsed Laser Method for Single Event Effects Testing and Fundamental Studies", IEEE Transactions on Nuclear Science, vol. 41, No. 6, Dec. 1994.

(56) References Cited

OTHER PUBLICATIONS

Moss, S., "Correlation of Picosecond Laser-Induced Latchup and Engergetic Particle-Induced Latchup in CMOS Test Structures", IEEE Transactions on Nuclear Science, vol. 42, No. 6, Dec. 1995.

Ng, Y., "Laser Voltage Imaging: A new Perspective of Laser Voltage Probing", ISTFA 2010.

Parrassin, T., "Laser Voltage and its derivatives, efficient techniques to address defect on 28nm technology", ISTFA 2013 Conference Proceedings from the 39th International Symposium for Testing and Failure Analysis, Nov. 3-7, 2013.

Safran, L., "Advanced Fault Localization through the use of Tester Based Diagnostics with LVI, LVP, CPA and PEM", ISTFA 2013 Conference Proceedings from the 39th International Symposium for Testing and Failure Analysis, Nov. 3-7, 2013.

Serrels, K.A., "Two Photon-Absorption-Enhanced Laser-Assisted Device Alteration and Single-Event Upsets in 28NM Silicon Integrated Circuits", ISTFA 2013.

Serrels, K.A., "Two-photon laser-assisted device alteration in silicon integrated-circuits", Optics Express, vol. 21, No. 24, Dec. 2, 2013.

Serrels, K.A., "Scan Chain Fault Isolation using Single Event Upsets Induced by a Picosecond 1064NM Laser", International Symposium for Testing and Failure Analysis, 2018.

Yeh, Dung-Han et al. "Synchronous-asynchronous laser mode-locking transition: experimental results." CLEO-2016. JTu5A.74. pdf pp. 1-2 *Department of Photonics and Institute of Electro-Optical Engineering, National Chiao Tung University*, Hsinchu, Taiwan, R.O.C.

Dickson, Kris et al. "Picosecond Time-Resolved LADA Integrated with a Solid Immersion Lens on a Laser Scanning Microscope." ISTFA™ 2017: Proceedings from the $43^{rd}$ International Symposium for Testing and Failure Analysis. Nov. 5-9, 2017, Pasadena, CA. pp. 1-10.

Mattey, Gaurav et al. "Time Resolved LADA using a Modulated Pulsed Laser to Fault Isolate Bridging Defects and Framing High Accuracy Physical FA Plan in 14nm FinFET Technologies." ISTFA™ 2017: Proceedings from the $43^{rd}$ International Symposium for Testing and Failure Analysis. Nov. 5-9, 2017, Pasadena, CA. pp. 1-5.

Moukhtari, I. EL. et al. "Analysis of Short-Term NBTI Effect on the Single-Event Upset Sensitivity of a 65nm SRAM Using Two-Photon Absorption." Proc. RADECS 2013 E-1 1/6. pp. 1-6.

\* cited by examiner

SYSTEM AND METHOD OF MULTIPLEXING LASER TRIGGERS AND OPTICALLY SELECTING MULTIPLEXED LASER PULSES FOR LASER ASSISTED DEVICE ALTERATION TESTING OF SEMICONDUCTOR DEVICE

BACKGROUND OF THE INVENTION

Field of the Invention

The present invention relates in general to identifying sensitive or performance limiting areas or suspect locations of semiconductor devices, and more specifically to a system and method of multiplexing laser triggers and optically selecting multiplexed laser pulses for laser assisted device alteration testing of semiconductor devices including conditioning laser pulse power and jitter parameters and multiplexing and amplifying laser effects.

Description of the Related Art

A variety of laser-based stimulation circuit testing techniques are known for failure or performance analysis of semiconductor devices. Laser stimulation involves the use of various forms of laser radiation with sufficient energy to modify operating behavior of semiconductor circuitry for the purpose of identifying potential problem areas of the semiconductor device. Although many types of radiation may be used, it is desired that the radiation convey sufficient energy to modify circuit operation for purposes of testing the limits of circuit operation. A laser beam, for example, is capable of conveying a significant level of power without damaging semiconductor circuitry and thus is often the radiation of choice for testing. The circuit modification may be any one or more of multiple types, such as modified timing of a device (e.g., transistor, gate, node, etc.), modified voltage level, modified current level, etc. A timing adjustment may reveal, for example, a race condition between two or more circuit paths thereby limiting maximum frequency of operation of the semiconductor device. Similarly, a marginal voltage or current level affecting pass-fail behavior may be revealed using laser perturbation during testing.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
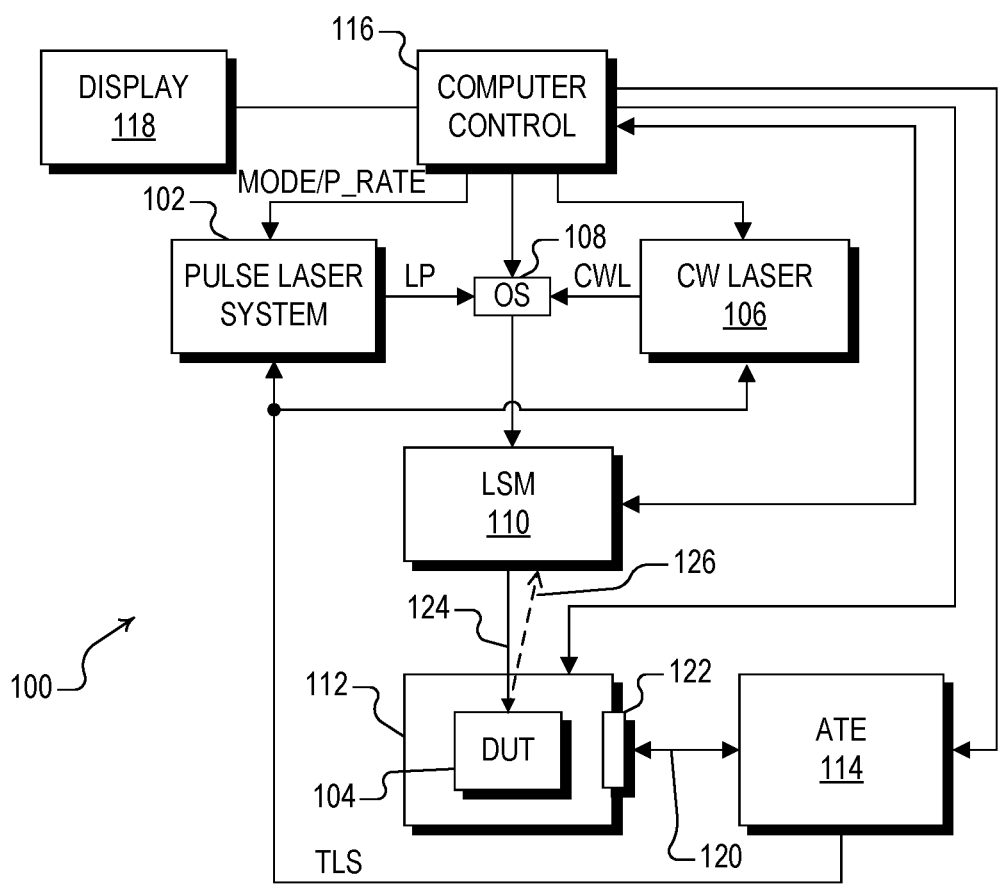
FIG. 1 is a simplified block diagram of a laser test system including a pulse laser system implemented according to an exemplary embodiment for testing a semiconductor device.

Laser assisted device alteration (LADA) is a laser scan technique used in the failure analysis of semiconductor devices. A laser generated or otherwise amplified by a laser scanning microscope (LSM) or the like is used to alter the operating characteristics of transistors, metal interconnects or other components on the semiconductor device under test (DUT) while it is electrically stimulated. Certain operating characteristics of the laser (e.g., wavelength, size, power, etc.) may be selected or otherwise adjusted to modify circuit characteristics, such as circuit timing and/or voltage or current levels. For example, a laser operating at a wavelength of approximately 1,064 nanometers (nm) produces localized photocurrents within active transistor layers in which the photo-generated currents modify circuit timing or voltage levels. Alternatively, a laser operating at a wavelength of approximately 1,340 nm produces localized heating which also alters circuit timing (e.g., slowing down of logic transitions).

It has been observed that photocurrent injection enables significantly larger timing shifts as compared to thermally induced alteration, so that photocurrent injection is more commonly used for "standard" LADA testing. Electrical stimulation of the DUT is usually performed by automated test equipment (ATE) which applies an ATE test loop or test pattern to the DUT and monitors the results. The term "ATE" as used herein refers to any test equipment or electronic device or system or the like which provides electrical stimulation to a DUT and which monitors results. The test pattern is designed by test engineers with multiple test vectors applied in sequential order to perform critical timing testing. The test equipment may also adjust one or more test variables, such as laser power, supply voltages, temperature, clock frequency, etc., to adjust operation relative to a pass-fail boundary of the voltage-frequency relationship (which may be plotted on a "shmoo" graph to illustrate the pass-fail boundary as known to those skilled in the art).

Earlier LADA testing was performed with continuous wave (CW) lasers. CW lasers, however, may cause a buildup of energy that can have an effect on the results and be detrimental to the test. A CW laser tends to transfer heat to the circuit injecting faults and causing latch-up issues. Nonetheless, CW lasers operated at low power are still useful in identifying suspect locations on the integrated circuit. Newer testing uses pulsed lasers with low duty cycle that achieves superior testing results without thermal buildup. Time-Resolved LADA (TR-LADA) provides improved test results as compared to conventional techniques, including CW LADA. TR-LADA provides significantly smaller localization, reduced complexity of speed path mapping and timing, improved observation of specific defect sites, improved fault isolation workflow for both speed path and functionally defective devices, etc.

The pulse laser has a continuous wave (CW) power output that is the result of the fiber amplifier reaching an excitation state which produces significant amplified spontaneous emission (ASE). The CW ASE output increases when a significantly long delay is interposed between successive laser pulses. The CW ASE output can interact with the DUT directly and interfere with the desired effect of the laser pulse. Furthermore the power level of the laser pulse is effected by the excitation level in the fiber, so when high ASE is present a more amplified laser pulse is generated which can damage the DUT. In addition to ASE and pulse power levels, the time from trigger to laser pulse output is also effected by the time between the laser pulses. For example, the laser pulse timing can be affected by the repetition rate and will therefore appear to show varying delay times and jitter when different repetition rates are used so that the laser pulse is not asserted precisely at the intended time. Additionally, the pulse energy versus time tends to spread or smear so that pulse becomes less defined in time and thus is less effective for test purposes. Furthermore, if the delay between pulses is excessively long, the pulse laser unit may simply shut off.

Semiconductor fabrication continues to improve. A laser scanning microscope image of a chip fabricated using a 55 nanometer (nm) or even down to a 40 nm process is often able to reveal individual transistor sites for more localized testing. The same laser scanning microscope image of a chip fabricated using a non-planar 16 nm FinFET technology including 3 dimensional (3D) information, however, can be very blurry so that individual devices are not readily discernible. There is a need to identify suspect locations and to accurately align each suspect location with the underlying circuitry for all types of semiconductor fabrication technology.

In semiconductor debug and failure analysis there are several dynamic laser analysis techniques that require stable power level and low time jitter laser pulses. The present inventors have recognized the need for preconditioning the circuitry of the device under test (DUT) and for identifying the location of suspect locations relative to the underlying circuit elements. They have therefore developed a system and method of multiplexing laser triggers and optically selecting multiplexed laser pulses for laser assisted device alteration testing of a semiconductor integrated circuit. A trigger mode controller multiplexes asynchronous pulse triggers and one or more probe pulse triggers to the trigger input of a pulse laser, which outputs multiplexed laser pulses. The trigger controller also controls a laser pulse modulator to select from among the multiplexed laser pulses to provide selected laser pulses to a scanning microscope.

The asynchronous pulse triggers generate asynchronous laser pulses that condition the pulse laser to provide one or more synchronous probe laser pulses with stable power level and low jitter. One or more asynchronous laser pulses may be passed by the laser pulse modulator just before a synchronous probe laser pulse to precondition the circuitry of the semiconductor device and thereby amplify the effects of the synchronous probe laser pulse. A series of asynchronous laser pulses may be passed by the laser pulse modulator subsequent to the synchronous probe laser pulse to generate single event upset (SEU) information in the same image providing suspect location information generated by the synchronous probe laser pulse. The SEU information is used to align the combined image to computer-aided design (CAD) masks or the like to more accurately identify the underlying circuitry at the suspect location.

FIG. 1 is a simplified block diagram of a laser test system 100 including a pulse laser system 102 implemented according to an exemplary embodiment for testing a semiconductor device, such as an integrated circuit (IC) or the like, shown as a device under test (DUT) 104. The laser test system 100 includes pulse laser system 102, a continuous wave (CW) laser 106, an optical switch 108, a laser scanning microscope (LSM) 110, a test fixture 112, automated test equipment (ATE) 114, a computer control unit 116, and a display device 118. The DUT 104 is installed or mounted onto the test fixture 112 which is mounted on or otherwise located in proximity with the LSM 110. An input/output (I/O) cable 120 (or multiple conductors or sensors or the like) is coupled between the ATE 114 and an input/output (I/O) interface 122 (e.g., connector or the like) of the test fixture 112. The test fixture 112 is configured to electrically couple each pin or node of interest of the DUT 104 to the I/O interface 122 when mounted for purposes of testing by the ATE 114. The computer control unit 116 is coupled to the pulse laser system 102, the CW laser 106, the optical switch 108, the test fixture 112 and the ATE 114 for purposes of controlling test operations. The computer control module 116 may provide one or more MODE signals to the pulse laser system 102 to control one or more mode types as further described herein. Also, the computer control module 116 may provide a pulse rate signal P_RATE to control a rate of asynchronous conditioning laser pulses as further described herein. Test operation between the ATE 114 and the pulse laser system 102 and/or the CW laser 106 may be synchronized by a test loop start (TLS) signal provided by the ATE 114 as further described herein.

The laser test system 100 is configured to perform several different test operations as further described herein. In general, the LSM 110 and the ATE 114 may be controlled to perform LADA testing to identify any "suspect locations" and to further identify the circuit components causing problem behavior. These "suspect locations" may include performance limiting areas or defective components or circuits or the like, and may include locations in which laser radiation is used to modify timing, voltage, and/or current level to identify race conditions, timing issues, pass-fail behavior, etc. In some embodiments, a laser beam is utilized that is capable of conveying a significant level of power without damaging semiconductor circuitry of the DUT 104, yet may convey sufficient energy to modify circuit operation for purposes of testing the limits of circuit operation of the DUT 104 while being tested by the ATE 114. The circuit modification may be any one or more of multiple types, such as modified timing of a device (e.g., transistor, gate, node, etc.), modified voltage level, modified current level, modified resistance, etc. A timing adjustment may reveal, for example, a race condition between two or more circuit paths thereby limiting maximum frequency of operation of the DUT 104. Similarly, a marginal voltage or current or resistance level affecting pass-fail behavior may be revealed using radiation perturbation during testing. It is appreciated that many other measurable variations of a device may be monitored for determining pass-fail behavior, such as an input/output (I/O) voltage level or timing, VDD or pin current, output frequency, a signal slew rate, etc.

The ATE 114 is configured to program any initial conditions or states of the DUT 104 and/or to provide one or more selected test patterns appropriate for the DUT 104 and to monitor and store test results. The ATE 114 may further be configured to adjust any one or more of selected operating conditions or parameters, such as voltage supply levels, clock frequency, temperature, etc. The test results from the ATE 114 may be forwarded to the computer control unit 116. The computer control unit 116 controls the optical switch 108 to select either laser pulses LP from the pulse laser system 102 or a continuous wave laser CWL provided by the CW laser 106 depending upon the test being performed, and the selected laser source is provided to the LSM 110. The LSM 110 applies the selected laser source as a laser beam 124 to the DUT 104. The LSM 110 scans an area of interest (entire circuit area of DUT 104 or a selected portion thereof) at an imaging power level, and a laser beam reflection 126 is reflected back to the LSM 110 to capture a reflected image. The reflected image may be provided to the computer control unit 116 for storage and/or display on the display device 118.

Figure 2:
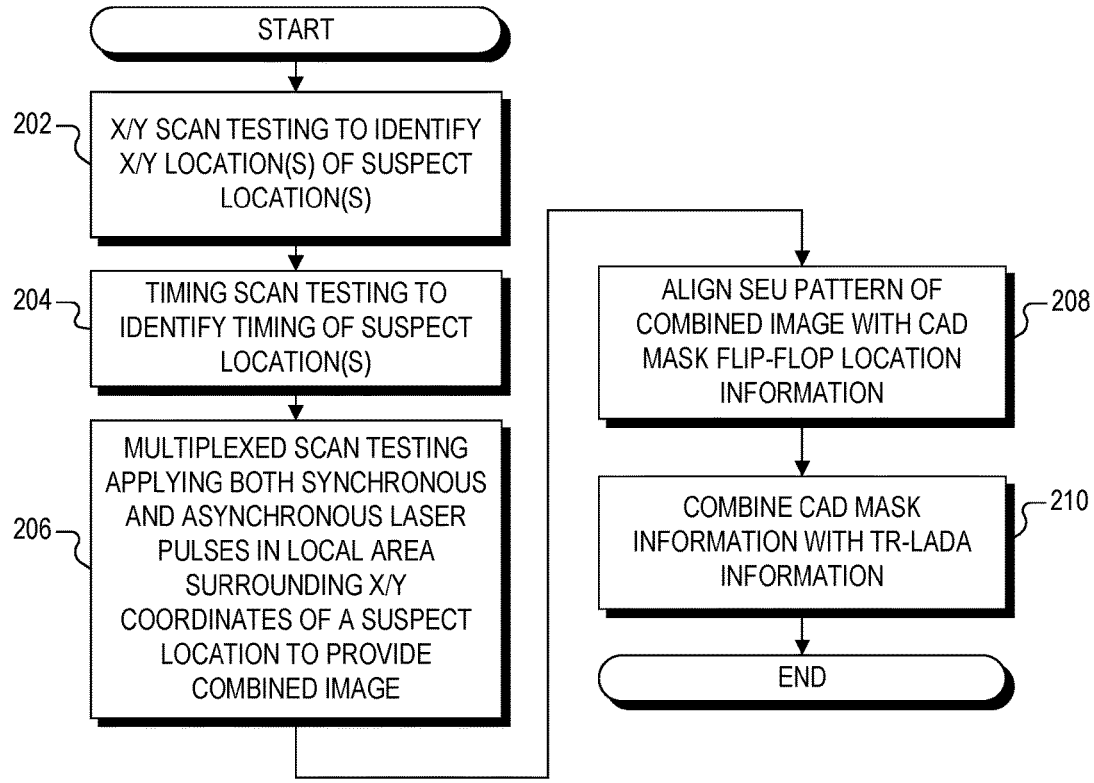
FIG. 2 is a simplified flowchart diagram illustrating an exemplary test procedure performed by the laser test system of FIG. 1 according to one embodiment.

FIG. 2 is a simplified flowchart diagram illustrating an exemplary test procedure performed by the laser test system 100 according to one embodiment. At a first block 202, one or more X/Y scan tests are performed to generally identify X/Y location of one or more suspect locations on the DUT 104. The CW laser 106 may be selected as the laser source and applied at low power to the DUT 104 while tests are performed by the ATE 114. For example, the CW laser 106 may be set to low power and applied by the LSM 110 via laser beam 124 to a particular point or "pixel" along the surface of the DUT 104 while the ATE 114 performs a complete test loop. The test results captured by the ATE 114 and the LSM 110 are stored for the current pixel and the laser beam 124 is advanced to the next pixel. The test procedure is repeated for each pixel in the entire circuit area or within a particular area of interest of the DUT 104. The test results are compiled and compared to identify the X/Y location of each suspect location of the DUT 104. It is noted that the X/Y information may be relatively coarse with relatively low accuracy.

At next block 204, one or more timing scan tests are performed to generally identify timing of each identified suspect location of the DUT 104. In one embodiment, TR-LADA techniques may be applied using laser pulses generated by the pulse laser system 102 to identify the timing associated with each suspect location. As an example, the local area surrounding the X/Y coordinates of a suspect location is selected, and the selected area is scanned, pixel by pixel, while applying laser pulses during the electronic test loop procedure. In one embodiment, a train of laser pulses at a 10 megahertz (MHz) rate may be applied to a pixel during the test loop providing first test feedback, the laser pulse train is advanced in time by an incremental amount, and the test procedure repeated for the same pixel until a laser pulse has been applied for each incremental time unit. For example, a pulse width of 25 picoseconds (ps) may be selected, each separated by 100 nanoseconds (ns), in which the entire pulse train is advanced by 5 ps for each test iteration. The test results are consolidated and evaluated to identify the timing associated with the suspect location of interest. It is noted that the TR-LADA techniques not only identify timing information, but may also be used to refine the X/Y information.

Once the X/Y and timing information is obtained, it is desired to identify the specific circuit device or devices associated with each suspect location. Such identification was more easily achieved with older technologies, such as fabrication using 55 nm processes and the like, but is more difficult with more modern fabrication, such as non-planar 16 nm FinFET technology and the like. SEU scans may be made to locate bi-stable devices such as flip-flops or the like; however, alignment between the SEU and TR-LADA images has proved challenging.

At next block 206, multiplexed scan testing is performed in which synchronous and asynchronous laser pulses are applied to the DUT 104 in a local area surrounding the X/Y coordinates of a suspect location to provide a combined image. This may be repeated for each set of X/Y locations. The synchronous laser pulse is synchronized with the test loop applied by the ATE 114 and driven with sufficient power to cause the greatest perturbation when the laser beam 124 is at or near the suspect location. The asynchronous laser pulses are asserted to identify SEU locations within the local area, and are asserted only with sufficient power level to upset a flip-flop when the laser pulse is applied to the flip-flop when being clocked or otherwise attempting to change state. Although the asynchronous laser pulses are not synchronized with the test being conducted by the ATE 114, a sufficient number are included and asserted at a sufficient rate to increase the likelihood of upsetting substantially all of the flip-flops in the local area during scan testing. The ability to combine the synchronous and asynchronous information into a single combined scan image eliminates alignment issues since each suspect location is mapped along with circuit flip-flops in the same scan image.

At next block 208, the SEU pattern of the combined image is aligned with CAD masking flip-flop location information to identify the circuit area of interest including the suspect location. The SEU and flip-flop location patterns are compared and matched and the image may be updated to include the flip-flop locations. At next block 210, the CAD mask information including the circuitry information that has been aligned with the combined image is combined with the TR-LADA information to identify the underlying circuitry at the precise location of the suspect location. Essentially, the SEU information is replaced with the aligned CAD mask so that the TR-LADA information identifying the suspect location is now precisely aligned with the circuitry. In this manner, the specific circuit components and devices associated with the suspect location can be identified.

Figure 3:
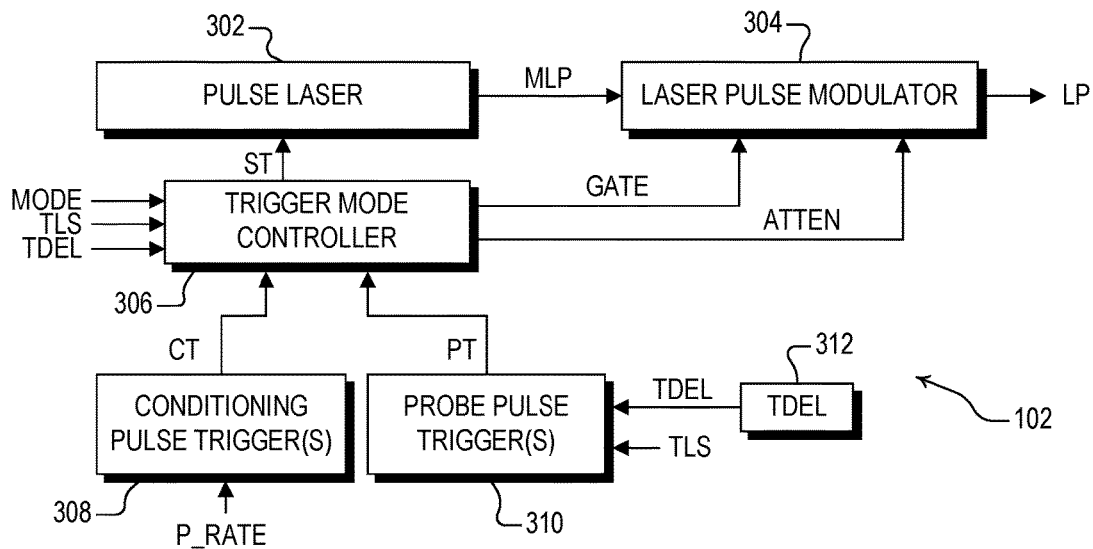
FIG. 3 is a simplified block diagram of the pulse laser system of FIG. 1 implemented according to one embodiment.

FIG. 3 is a simplified block diagram of the pulse laser system 102 implemented according to one embodiment. The pulse laser system 102 includes a pulse laser 302, a laser pulse modulator 304, a trigger mode controller 306, a conditioning pulse trigger module 308, and a probe pulse trigger module 310. A local memory 312, such as a register or the like, stores a delay value TDEL further described herein. Alternatively, the memory 312 may be provided in another device, such as the computer control unit 116, which provides TDEL to the pulse laser system 102. In one embodiment, the pulse laser 302 incorporates a gain-switched laser diode with fiber amplifiers, and is capable of delivering laser pulses having a width of 25 ps and 5 ps temporal increments, such as the OneFive Katana pulsed laser by NKT Photonics. The laser pulse modulator 304 may be a fiber-coupled acousto-optic modulator (AOM) or an electro-optic modulator (EOM) or the like. The pulse laser 302 has a trigger input receiving a selected trigger (ST) signal and has an output providing multiplexed laser pulses (MLP) along an optical path to an optical input of the laser pulse modulator 304. The trigger signal ST conveys one or more trigger pulses that prompt the pulse laser 302 to output a corresponding laser pulse on MLP. The laser pulse modulator 304 also includes a gate input receiving a GATE signal, a gain input receiving an attenuation (ATTEN) signal, and an optical output providing the LP signal to the optical switch 108.

The trigger mode controller 306 has control inputs receiving the MODE and TLS signals and the TDEL value, a first trigger input receiving a conditioning trigger (CT) signal, a second trigger input receiving a probe trigger (PT) signal, an output providing the ST signal to the trigger input of the pulse laser 302, and control outputs providing the GATE and ATTEN signals. The conditioning pulse trigger module 308 receives the P_RATE signal and asserts asynchronous trigger pulses on the CT signal at the selected pulse rate, such as 10 MHz, 20 MHz, 50 MHz, etc. The trigger pulses are considered asynchronous relative to tests performed by the ATE 114. The probe pulse trigger module 310 receives the TLS signal from the ATE 114 indicating the start of a test loop, receives the TDEL value, and provides a synchronized probe trigger pulse on the PT signal after a predetermined delay determined by TDEL. TDEL may be determined from TR-LADA timing information based on timing scan testing as previously described. The synchronized probe trigger pulse asserted on the PT signal is synchronized with the tests performed by the ATE 114 since asserted at a timing delay specified by TDEL relative to TLS.

In operation, the pulse laser 302 may be set up or otherwise programmed to output laser pulses on the MLP signal according to particular characteristics, such as having a particular width (e.g., 25 ps) and at a specified power level. The computer control unit 116 specifies the mode of operation and asserts the MODE signal accordingly, and specifies the rate of asynchronous pulses and asserts the P-RATE signal accordingly. The pulse trigger module 308 receives P_RATE and outputs trigger pulses on the CT signal at the specified pulse rate. The probe pulse trigger module 310 asserts a probe trigger pulse on the PT signal after the predetermined delay (TDEL) after each assertion of the TLS signal. The trigger mode controller 306 effectively operates as a multiplexer for selecting between CT and PT for providing selected trigger pulses on ST. Generally, the trigger mode controller 306 selects the CT signal until a synchronized probe trigger pulse is scheduled on the PT signal, then switches to the select the PT signal to convey the probe trigger pulse, and then switches back to the CT signal. The trigger mode controller 306 may use the TLS signal and the TDEL value to determine the timing of the synchronized probe trigger pulse.

The trigger mode controller 306 asserts the GATE and ATTEN signals based on the mode of operation as further described herein. The laser pulse modulator 304 effectively operates as a pass gate for passing only selected laser pulses on MLP to LP. In the illustrated configuration, the laser pulse modulator 304 passes laser pulses asserted on MLP to the LP signal when GATE is asserted high, and otherwise blocks the laser pulses on MLP when GATE is negated low. The ATTEN signal is used to control the relative power and/or magnitude of the laser pulses passed onto the LP signal. If the ATTEN signal indicates 100%, then the laser pulse is effectively passed at full power. Otherwise, the laser pulse power and/or magnitude is attenuated by a percentage amount based on the level indicated by the ATTEN signal. As an example, it may be desired to pass a synchronous probe laser pulse generated in response to a trigger pulse on PT at full power, but to attenuate the power level of asynchronous conditioning pulses asserted in response to trigger pulses on the CT signal.

Figure 4:
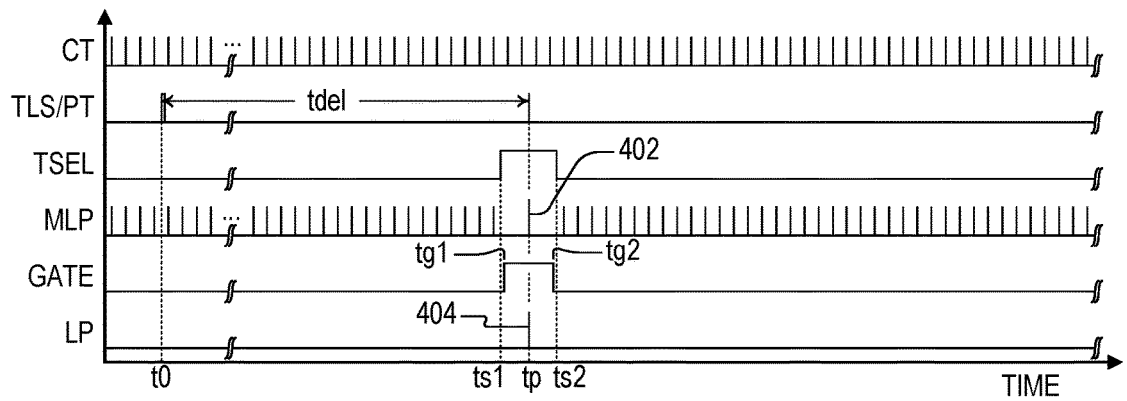
FIG. 4 is a timing diagram illustrating operation of the pulse laser system of FIG. 1 according to a first mode of operation for conditioning a synchronized probe laser pulse.
Figure 5:
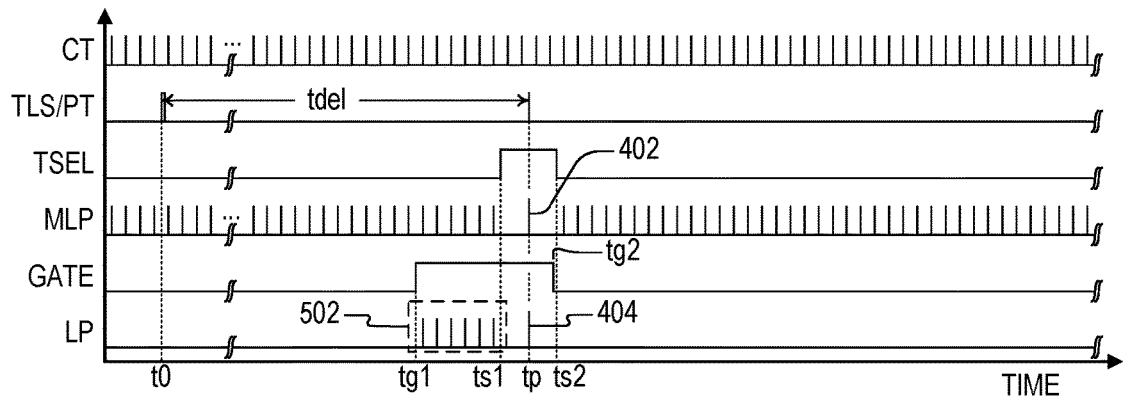
FIG. 5 is a timing diagram illustrating operation of the pulse laser system of FIG. 1 according to a second mode of operation for conditioning the circuitry of the semiconductor device being tested.
Figure 6:
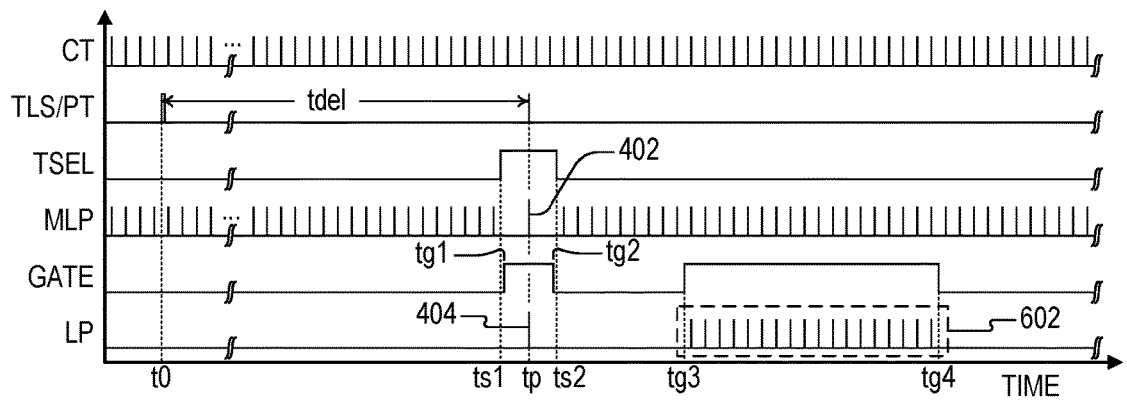
FIG. 6 is a timing diagram illustrating operation of the pulse laser system of FIG. 1 according to a third mode of operation for providing the synchronized probe laser pulse along with alignment laser pulses for generating a combined image.

FIGS. 4, 5, and 6 are timing diagrams illustrating operation of the pulse laser system 102 according to first, second, and third modes of operation, respectively. In each timing diagram, the signals CT, TLS, PT, MLP, GATE, and LP along with a trigger select signal TSEL are plotted verses time. When the TSEL signal is low, the trigger mode controller 306 selects the CT signal as the ST signal, and when TSEL is high, the trigger mode controller 306 selects the PT signal as the ST signal. The CT, TLS/PT, TSEL, and MLP signals are essentially the same in each timing diagram. The CT signal asserts a series of asynchronous trigger pulses at a rate selected by P_RATE as previously described.

The TLS signal is plotted along the same timeline as the PT signal. At an initial time t0, the TLS signal is pulsed high indicating the beginning of the electronic test performed by the ATE 114. At a time tp after the specific delay period shown as tdel after t0, a synchronous trigger pulse is asserted on the PT signal. It is noted that the delay period tdel is based on the TDEL value.

The TSEL signal is initially low after time t0 so that the trigger mode controller 306 selects the asynchronous trigger pulses on CT as the selected trigger pulses asserted on the ST signal. The asynchronous trigger pulses cause the pulse laser 302 to output a corresponding series of asynchronous conditioning laser pulses on the MLP signal. Just prior to time tp at a time ts1, the TSEL signal is asserted high to select PT as ST. Initially there are no trigger pulses asserted on PT so that the series of asynchronous laser pulses on the MLP signal are temporarily stopped. Then at time tp subsequent to time ts1, the trigger pulse occurs on PT, which causes the pulse laser 302 to assert a synchronized probe laser pulse 402 on MLP. Then after another delay from time tp, the TSEL is asserted back low at time ts2 to select CT once again. After time ts2, the pulse laser 302 once again asserts a series of asynchronous laser pulses on the MLP signal in response to the CT trigger pulses.

It is noted that TSEL is asserted high a specified pre delay period (predp) before tp at time ts1 and is asserted back low at time ts2 after a specified post delay period (postdp) from time tp (e.g., ts1=tp−predp and ts2=tp+postdp). The pre delay period predp from ts1 to tp and the post delay period postdp from tp to ts2 are configured to provide a timing guard band or the like to sufficiently isolate the synchronized probe laser pulse 402 from the asynchronous conditioning laser pulses on the MLP. The predp and postdp periods may be programmed or otherwise preset in which the relative timing is based on the TLS signal and the TDEL value (which determines tdel).

FIG. 4 illustrates the first mode of operation. In this first mode, the GATE signal is initially negated low just after time t0 to block the conditioning laser pulses from LP. The GATE signal is asserted high at a time tg1 and then is negated low at a subsequent time tg2. The time tg1 appears coincident with time ts1 before tp, and the time tg2 appears coincident with time ts2 after tp. In one embodiment, tg1 may be just after time ts1 and tg2 may be just before time ts2. When the GATE signal is toggled in this manner, the laser pulse modulator 304 passes the synchronized probe laser pulse 402 on MLP at about time tp as a synchronized probe laser pulse 404 on the LP signal. In this first mode, none of the conditioning laser pulses appearing on MLP are passed to LP.

The first mode of operation shown in FIG. 4 conditions the synchronized probe laser pulse 404 asserted on LP coincident with the probe trigger pulse on PT. Instead of simply generating only the synchronized probe laser pulse 404 by the pulse laser 302 on LP, the pulse laser 302 generates a train of asynchronous conditioning pulses before and after the synchronized probe laser pulse 402 on MLP. It is known that the pulse laser 302 may have an amplified spontaneous emission (ASE) power output that generates continuous wave (CW) power in the form of background emissions that modify pulse characteristics when a significantly long delay is interposed between successive laser pulses. Thus, if only the synchronized probe laser pulse 404 is generated alone without the train of asynchronous laser pulses, the synchronized probe laser pulse 404 may exhibit time jitter and not be asserted at the precise time desired. Also, the synchronized probe laser pulse 404 may be spread or smeared so that laser pulse becomes less defined and thus less effective for test purposes. The train of asynchronous conditioning laser pulses reduce the ASE (excitation level) so that the CW output is reduced and stable pulse powers are achieved. Stated another way, the asynchronous conditioning laser pulses prevent the ASE power output so that the synchronized probe laser pulse 404 is generated cleanly without time jitter or power variation or smear. The gating function performed by the trigger mode controller 306 and the laser pulse modulator 304, however, blocks the asynchronous laser pulses from appearing on the LP signal, so that they are not applied to the DUT 104 by the LSM 110. Instead, only the clean and jitter-free synchronized probe laser pulse 404 is output onto LP and provided to the LSM 110 at precisely time tp for test purposes.

The first mode of operation may be used for TR-LADA during timing scan testing as shown and described for block 204 in FIG. 2. The asynchronous conditioning laser pulses generated by the pulse laser 302 prevent DC power build up that might otherwise impair pulses used for timing purposes. The laser pulse modulator 304 gates the laser pulses so that only the synchronized laser pulses are applied to the LUT 104.

FIG. 5 illustrates the second mode of operation. In this second mode, the GATE signal is again initially negated low just after time t0 to block the conditioning laser pulses from LP. The GATE signal is asserted high at a time tg0, and is then negated low at the subsequent time tg2. The time tg0 is before time tg1 and is coincident with several of the asynchronous laser pulses on MLP that occur just before the synchronized probe laser pulse 402. When the GATE signal is toggled in this manner, the laser pulse modulator 304 passes one or more of the asynchronous conditioning laser pulses on MLP as one or more preconditioning laser pulses 502 to the LP signal and also passes the synchronized probe laser pulse 402 as the synchronized probe laser pulse 404 to the LP signal. In this second mode, one or more preconditioning laser pulses 502 are provided on the LP signal before the synchronous probe laser pulse 404.

The second mode of operation shown in FIG. 5 performs the dual purpose of conditioning the synchronized probe laser pulse 404 asserted on LP coincident with the probe pulse trigger on PT, as well as conditioning the circuitry of the DUT 104 during testing. Since the MLP signal is identical in both FIGS. 4 and 5, the synchronized probe laser pulse 404 asserted at time tp is also clean and time jitter free. The preconditioning laser pulses 502 have no direct impact on the synchronized probe laser pulse 404. The preconditioning laser pulses 502 generated before synchronized probe laser pulse 404 on the LP signal, however, have the effect of preconditioning the circuitry or otherwise altering characteristics of the circuitry to amplify the effect of the synchronized probe laser pulse 404 on the circuitry. For example, the preconditioning laser pulses 502 lower the threshold voltages of MOS or FET transistors and interact with semiconductor device wells to precondition the circuitry for the synchronized probe laser pulse 404. Such preconditioning may be used to reduce the power level of the synchronized probe laser pulse 404 while having substantially the same effect on the circuit. Alternatively, such preconditioning amplifies the effect of the synchronized probe laser pulse 404 to enable circuit effects that would otherwise not be present.

The second mode of operation may also be used for TR-LADA during timing scan testing as shown and described for block 204 in FIG. 2. The asynchronous conditioning laser pulses generated by the pulse laser 302 prevent DC power build up that might otherwise impair pulses used for timing purposes. The laser pulse modulator 304 gates the laser pulses so that only the desired laser pulses are applied to the LUT 104. The trigger mode controller 306 allows a few of the asynchronous conditioning laser pulses through as preconditioning laser pulses on LP and thus applied the LUT 104 to condition the circuitry to improve the effectiveness of the synchronized probe laser pulses.

FIG. 6 illustrates the third mode of operation. In this third mode, the GATE signal is again initially negated low just after time t0 to block the conditioning laser pulses from LP. Then the GATE signal is asserted high at time tg1 and negated low at time tg2 in the same manner as shown in FIG. 4 to generate the synchronized probe laser pulse 404 onto the LP signal in substantially the same manner. In addition, at a subsequent time tg3, the GATE signal is again asserted high a subsequent time tg3 and then negated back low at a time tg4. In this case, a set of the asynchronous conditioning laser pulses on the MLP signal after the synchronized probe laser pulse 404 are asserted as a series of alignment laser pulses 602 onto the LP signal and thus applied to the DUT 104.

The third mode of operation shown in FIG. 6 performs the dual purpose of conditioning the synchronized probe laser pulse 404 asserted on LP coincident with the probe pulse trigger on PT, as well as providing the alignment laser pulses 602 for the purposes of generating SEU image information combined with the synchronous TR-LADA information. P-RATE is selected to assert the alignment laser pulses 602 at a sufficiently high rate, and GATE is asserted high between times tg3 and tg4 to pass a sufficient number of the alignment laser pulses 602 to increase the probability of upsetting each flip-flop in the local area. Thus, the subsequent alignment laser pulses 602 applied to the DUT 104 capture SEU site information for alignment purposes independent of the synchronized probe laser pulse 404, yet doing so in the same scan test. As described herein, the capture of synchronous probe information along with asynchronous alignment information improves alignment for purposes of determining the underlying circuitry associated with each suspect location. The third mode of operation is advantageous for multiplexed scan testing as shown and described for block 206 in FIG. 2 for generating a combined image including SEU and TR-LADA information.

Figure 7:
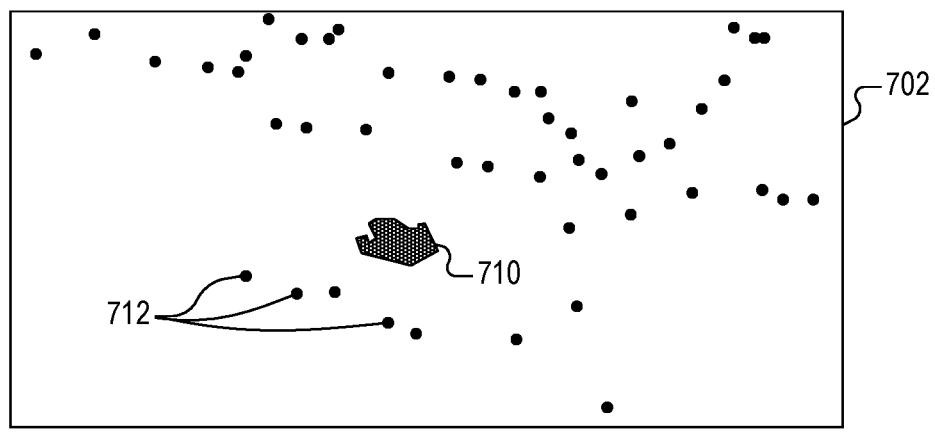
FIG. 7 is a series of scan images illustrating results of the operation of the laser test system of FIG. 1 during multiplexed scan testing, flip-flop identification, and image alignment and circuit identification.
Figure 7:
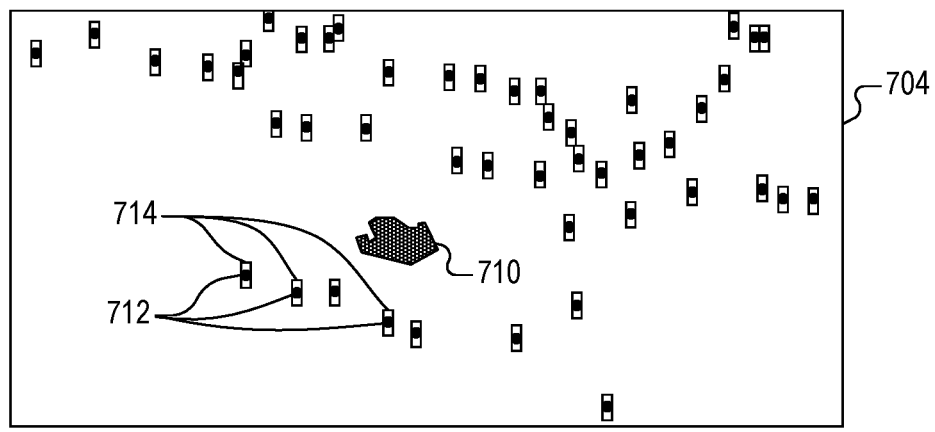
Figure 7:
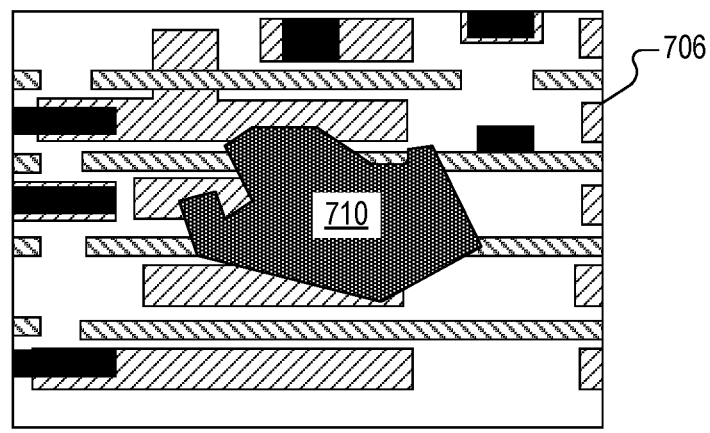

FIG. 7 is a series of scan images 702, 704, and 706 illustrating results of the operation of the laser test system 100 during multiplexed scan testing (image 702), flip-flop identification (image 704), and image alignment and circuit identification (image 706), respectively, as described in blocks 206, 208, and 210, respectively, of FIG. 2. The first image 702 illustrates the results of multiplexed scan testing in which the pulse pattern on the LP signal shown in FIG. 6, including the synchronized probe laser pulse 404 and the alignment laser pulses 602, is applied to each pixel location of a local area surrounding a suspect location 710 identified during TR-LADA testing. The suspect location 710 is illustrated in simplified form as a shaded polygon shape. The remaining dark circles speckled across the image 702 represent upset locations 712 which identify locations of flip-flops in the circuit which have been "upset" or switched to the incorrect state during the multiplexed scan testing as identified by electronic testing performed by the ATE 114.

The image 704 includes the suspect location 710 and the upset locations 712 coincident with flip-flop locations 714 transcribed from corresponding CAD mask information. The flip-flop locations 714 are shown in simplified form as rectangular shapes. In general, the pattern of upset locations 712 of the image 702 is compared with and matched to a corresponding pattern of flip-flops of the CAD mask in the local area of interest. Once this mapping is performed and matched, the specific circuit location of the suspect location 710 can be determined relative to the flip-flop locations 714.

The image 706 is a zoomed in depiction of the circuit area immediately surrounding the suspect location 710. The image 706 includes the suspect location 710 combined with the aligned CAD image precisely locating the underlying circuit component geometry relative to the suspect location 710. The aligned CAD image is shown in simplified form as corresponding geometric shapes. In this manner, the circuit elements and components located at the specific suspect location 710 can be readily and accurately identified and evaluated.

A combination of the second and third operating modes is contemplated. Although not specifically shown, the GATE signal may be asserted high to include both the preconditioning laser pulses 502 and the alignment laser pulses 602 along with the synchronized probe laser pulse 404.

A pulse laser test system according to one embodiment includes a conditioning pulse circuit, a probe pulse circuit, a pulse laser, a trigger mode controller, and a laser pulse modulator. The conditioning pulse circuit has an output that provides asynchronous conditioning trigger pulses at a selected rate. The probe pulse circuit has an output that provides a synchronized probe trigger pulse. The pulse laser has a pulse trigger input and a laser output providing a laser pulse for each trigger pulse provided to the pulse trigger input. The trigger mode controller provides selected trigger pulses to the pulse trigger input of the pulse laser. In particular, the trigger mode controller selects the output of the probe pulse circuit while the synchronized probe trigger pulse is provided causing the pulse laser to provide a synchronized probe laser pulse, and the trigger mode controller otherwise selects the output of the conditioning pulse circuit causing the pulse laser to provide asynchronous conditioning laser pulses. The laser pulse modulator has an optical input coupled to the laser output of the pulse laser, has a gating input receiving a gate signal from the trigger mode controller, and has an optical output that provides laser pulses passed from the pulse laser while the gate signal is asserted.

The asynchronous conditioning laser pulses generated by the pulse laser reduce the ASE (excitation level) so that the CW output is reduced and stable pulse powers are achieved. Stated another way, the asynchronous conditioning laser pulses prevent the ASE power output so that the synchronized probe laser pulse is generated cleanly without time jitter or power variation or smear.

The trigger mode controller controls the gate signal to pass any of the laser pulses output from the pulse laser. The trigger mode controller may assert the gate signal to pass only the synchronized probe laser pulse, or to pass the synchronized probe laser pulse and at least one of asynchronous conditioning laser pulse provided before the synchronized probe laser pulse, or to pass the synchronized probe laser pulse and at least one asynchronous conditioning laser pulse provided after the synchronized probe laser pulse, or a to pass the synchronized probe laser pulse and at least one asynchronous conditioning laser pulses before and after the synchronized probe laser pulse. Asynchronous conditioning laser pulses passed before the synchronized probe laser pulse may be used to condition the circuitry of a semiconductor device being tested. Asynchronous conditioning laser pass provided after the synchronized probe laser pulse may be used to generate single event upset (SEU) data for alignment purposes.

The trigger mode controller further may provide an attenuation signal that causes the laser pulse modulator to attenuate any of the laser pulses that are passed by an amount indicated by the attenuation signal. The pulse laser test system may include automated test equipment that provides a test loop start signal to the probe pulse module to determine timing of providing the synchronized probe trigger pulse. The trigger mode controller insert a predetermined pre pulse delay before the synchronized probe trigger pulse and a predetermined post pulse delay after the synchronized probe pulse trigger.

A method of generating laser pulses for laser assisted device alteration testing according to one embodiment includes providing asynchronous conditioning trigger pulses at a selected rate, providing a synchronized probe trigger pulse while the asynchronous conditioning trigger pulses are provided, selecting the synchronized probe trigger pulse when provided and otherwise selecting the asynchronous conditioning trigger pulses and providing selected trigger pulses to a pulse trigger input of a pulse laser, generating, by the pulse laser, multiplexed laser pulses in response to the selected trigger pulses including asynchronous conditioning laser pulses before and after a synchronized probe laser pulse, and modulating the multiplexed laser pulses to pass at least the synchronized probe laser pulse for laser assisted device alteration testing.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A pulse laser test system, comprising:
   a conditioning pulse circuit having an output that provides a plurality of asynchronous conditioning trigger pulses at a selected rate;
   a probe pulse circuit having an output that provides a synchronized probe trigger pulse;
   a pulse laser having a pulse trigger input and a laser output providing a laser pulse for each trigger pulse provided to said pulse trigger input;
   a trigger mode controller that provides selected trigger pulses to said pulse trigger input of said pulse laser, wherein said trigger mode controller selects said output of said probe pulse circuit while said synchronized probe trigger pulse is provided causing said pulse laser to provide a synchronized probe laser pulse, and wherein said trigger mode controller otherwise selects said output of said conditioning pulse circuit causing said pulse laser to provide a plurality of asynchronous conditioning laser pulses; and a laser pulse modulator having an optical input coupled to said laser output of said pulse laser, having a gating input receiving a gate signal from said trigger mode controller, and having an optical output that provides laser pulses passed from said pulse laser while said gate signal is asserted.

2. The pulse laser test system of claim 1, wherein said trigger mode controller asserts said gate signal to pass only said synchronized probe laser pulse.

3. The pulse laser test system of claim 1, wherein said trigger mode controller asserts said gate signal to pass said synchronized probe laser pulse and at least one of said plurality of asynchronous conditioning laser pulses provided before said synchronized probe laser pulse.

4. The pulse laser test system of claim 3, wherein said trigger mode controller asserts said gate signal and keeps said gate signal asserted to pass said at least one of said plurality of asynchronous conditioning laser pulses provided before said synchronized probe laser pulse and to pass said synchronized probe laser pulse, and then negates said gate signal to block each of said plurality of asynchronous conditioning laser pulses provided after said synchronized probe laser pulse.

5. The pulse laser test system of claim 1, wherein said trigger mode controller asserts said gate signal to pass said synchronized probe laser pulse and at least one of said plurality of asynchronous conditioning laser pulses provided after said synchronized probe laser pulse.

6. The pulse laser test system of claim 1, wherein said trigger mode controller negates said gate signal to block any of said plurality of asynchronous conditioning laser pulses provided before said synchronized probe laser pulse, then asserts said gate signal to pass said synchronized probe laser pulse, then negates said gate signal to block at least one of said plurality of asynchronous conditioning laser pulse provided after said synchronized probe laser pulse, then re-asserts said gate signal to pass a consecutive series of said plurality of said asynchronous conditioning laser pulses, and then negates said gate signal after said consecutive series of said plurality of said asynchronous conditioning laser pulses is completed.

7. The pulse laser test system of claim 6, wherein said trigger mode controller re-asserts said gate signal to pass a sufficient number of said consecutive series of said plurality of said asynchronous conditioning laser pulses to generate single event upset information.

8. The pulse laser test system of claim 1, wherein said trigger mode controller further provides an attenuation signal that causes said laser pulse modulator to attenuate any of said laser pulses that are passed by an amount indicated by said attenuation signal.

9. The pulse laser test system of claim 1, further comprising automated test equipment that provides a test loop start signal to said probe pulse module to determine timing of providing said synchronized probe trigger pulse.

10. The pulse laser test system of claim 1, wherein said trigger mode controller selects said output of said probe pulse module by a predetermined pre pulse delay before said synchronized probe trigger pulse is provided, and continues to select said output of said probe pulse module by a predetermined post pulse delay after said synchronized probe pulse trigger is provided.

11. A method of generating laser pulses for laser assisted device alteration testing, comprising:
providing a plurality of asynchronous conditioning trigger pulses at a selected rate;
providing a synchronized probe trigger pulse while the plurality of asynchronous conditioning trigger pulses are provided;
selecting the synchronized probe trigger pulse when provided and otherwise selecting the plurality of asynchronous conditioning trigger pulses and providing selected trigger pulses to a pulse trigger input of a pulse laser;
generating, by the pulse laser, multiplexed laser pulses in response to the selected trigger pulses including a plurality of asynchronous conditioning laser pulses before and after a synchronized probe laser pulse; and
modulating the multiplexed laser pulses to pass at least the synchronized probe laser pulse for laser assisted device alteration testing.

12. The method of claim 11, wherein said modulating comprises modulating the multiplexed laser pulses to pass only the synchronized probe laser pulse while not passing any of the asynchronous conditioning laser pulses.

13. The method of claim 11, wherein said modulating comprises modulating the multiplexed laser pulses to pass the synchronized probe laser pulse and at least one of the asynchronous conditioning laser pulses provided before the synchronized probe laser pulse.

14. The method of claim 11, wherein said modulating comprises modulating the multiplexed laser pulses to pass the synchronized probe laser pulse and at least one of the asynchronous conditioning laser pulses provided immediately before the synchronized probe laser pulse.

15. The method of claim 11, wherein said modulating comprises modulating the multiplexed laser pulses to pass the synchronized probe laser pulse and at least one of the asynchronous conditioning laser pulses provided after the synchronized probe laser pulse.

16. The method of claim 11, wherein said modulating comprises modulating the multiplexed laser pulses to block the asynchronous conditioning laser pulses provided before the synchronized probe laser pulse, to pass the synchronized probe laser pulse, to block at least one asynchronous conditioning laser pulse after the synchronized probe laser pulse, to pass a consecutive set of the asynchronous conditioning laser pulses provided after blocking the at least one asynchronous conditioning laser pulse, and to block remaining asynchronous conditioning laser pulses after the consecutive set of the asynchronous conditioning laser pulses.

17. The method of claim 16, wherein said modulating the multiplexed laser pulses to pass a consecutive set of the asynchronous conditioning laser pulses comprises modulating the multiplexed laser pulses to pass a sufficient number of consecutive asynchronous conditioning laser pulses to obtain single event upset information.

18. The method of claim 11, further comprising attenuating at least one of the multiplexed laser pulses that are passed by said modulation.

19. The method of claim 11, wherein said providing a synchronized probe trigger pulse comprises providing a synchronized probe trigger pulse a predetermined time period after a test loop start signal is received.

20. The method of claim 11, wherein said selecting the synchronized probe trigger pulse comprises inserting a pre delay period before the synchronized probe trigger pulse and inserting a post delay period after the synchronized probe trigger pulse.

* * * * *